US007126197B2

(12) United States Patent
Sin et al.

(10) Patent No.: US 7,126,197 B2
(45) Date of Patent: Oct. 24, 2006

(54) POWER MOSFET AND METHODS OF MAKING SAME

(75) Inventors: Kin On Johnny Sin, Hong Kong (HK); Mau Lam Tommy Lai, Hong Kong (HK)

(73) Assignee: Kin-On Johnny Sin, Hong Kong (HK)

( * ) Notice: Subject to any disclaimer, the term of this patent is extended or adjusted under 35 U.S.C. 154(b) by 26 days.

(21) Appl. No.: 10/844,344

(22) Filed: May 13, 2004

(65) Prior Publication Data
US 2005/0121720 A1    Jun. 9, 2005

(30) Foreign Application Priority Data
Dec. 8, 2003    (CN) ............................. 03 1 08898

(51) Int. Cl.
H01L 29/28    (2006.01)
H01L 21/336    (2006.01)
(52) U.S. Cl. ..................... 257/401; 257/409; 438/294
(58) Field of Classification Search ............... 257/401; 438/294
See application file for complete search history.

(56) References Cited

U.S. PATENT DOCUMENTS

| 5,120,668 | A | * | 6/1992 | Hsu et al. .................... 438/301 |
| 5,960,275 | A |   | 9/1999 | So et al. |
| 6,049,104 | A |   | 4/2000 | Hshieh et al. |
| 7,056,799 | B1 | * | 6/2006 | Phua et al. .................. 438/303 |
| 2004/0097041 | A1 | * | 5/2004 | Mandelman et al. ....... 438/270 |
| 2004/0113212 | A1 | * | 6/2004 | Lee et al. .................... 257/408 |
| 2005/0186744 | A1 | * | 8/2005 | Abadeer et al. ............ 438/291 |
| 2005/0227423 | A1 | * | 10/2005 | Phua et al. .................. 438/185 |

* cited by examiner

Primary Examiner—Evan Pert
(74) Attorney, Agent, or Firm—Buchanan Ingersoll & Rooney PC (57) ABSTRACT

A method of forming a power MOSFET having a substrate of a first conductivity type and a body region of a second conductivity type. The method includes the steps of forming a gate region of a pre-determined pattern and with a plurality of gate elements partially covering the substrate. The gate element has a stepped cross-sectional profile with a thicker portion and a thinner portion. The thicker portion is adapted to substantially prevent passage of impurities therethrough into the substrate during the impurities implantation step. The thinner portion is adapted to allow partial passage of impurities therethrough during the impurities implantation step. Impurities are implanted into the substrate from the gate region side of the substrate to form a body region of the second conductivity type. After the impurities implantation step, a step-profiled body region, having a shallow body region and a deep body region, is formed in the substrate with impurities also present underneath pre-determined regions of the gate elements.

34 Claims, 7 Drawing Sheets

Back metal

FIG. 22

POWER MOSFET AND METHODS OF MAKING SAME

FIELD OF THE INVENTION

The present invention relates to MOSFETs and, more particularly, to power MOSFETs. More specifically, although of course not solely limited thereto, this invention relates to vertical power MOSFETs, especially power MOSFETs having a high cell density, a shallow body junction and a short channel length.

BACKGROUND OF THE INVENTION

Power MOSFETs (Metal-Oxide-Semiconductor Field Effect Transistors) are widely used and can be found in many electronic devices and apparatus. Well-known applications of power MOSFETs include, for example, power management and DC/DC conversion for desktop and notebook computers, portable devices and automotive electronics. Power MOSFETs are typically used as switching devices in such applications for controlling power delivery from the power source to the load. As a switching device, it is highly desirable to have minimal power loss across the device during power transfer. To achieve this, the on-resistance of a power MOSFET should be as low as possible. When translated into power MOSFET device design, a small cell pitch, that is, a small distance between adjacent cells, is highly desirable since a power MOSFET device typically comprises a plurality of transistor cells connected in parallel in order to meet with the large current requirements.

In the description below and throughout the specification, the terms "MOSFET" and "power MOSFET" are used interchangely to mean a power MOSFET to the extent appropriate and where the context permits. Planar VDMOS (Vertical Double-Diffused MOS) transistors are one of the most popular conventional power MOSFETs in which the channel is formed first by body implantation and then by lateral diffusion of dopants or impurities underneath the polycrystalline silicon ("polysilicon" or "poly" in short) gate at high temperature (around 1100° C. to 1150° C.) and with a long thermal cycle (around 90 to 300 minutes). Since the channel is formed by diffusion, the channel length needs to be long enough to have sustainable charges for a stable threshold voltage.

On the other hand, formation of a long channel length by lateral diffusion at high temperature and long thermal cycle means that the body-junction will have to be driven deeper and this will result in a deeper body-junction. A deeper body-junction consumes more lateral spacing between two adjacent body regions and also causes a more severe JFET (Junction Field Effect Transistor) effect. Aggravated JFET effect could induce early pinch-off in the area between the adjacent body-junctions and will degrade the device's on-state resistance. In addition, a power MOSFET with a deep body-junction also requires a thicker epitaxial ("epi") layer in order to maintain the same blocking voltage. However, a thicker epi layer will result in a higher on-state resistance.

To alleviate undesirable JFET effect for a low on-resistance, an increase in cell size and a decrease in packing density seem inevitable. However, this translates into a higher chip cost. In addition, the typical square cell design of a planar VDMOS leads to a three-dimensional diffusion problem at the cell corners. This diffusion problem is primarily a result of a lower lateral diffusion rate of the impurity, which is typically about 20% lower than the vertical diffusion rate. Furthermore, as a result of t he known spreading effect at the cell corners, the diffusion rate of the impurities at the cell corners is even lower, at only around 50% of the lateral diffusion rate. This lower diffusion rate is even more severe for P-type impurities. Because of this lower diffusion rate, the channel length at the cell corners will become shorter and will lead to early punch-through breakdown of the channel at the square cell corners. As a result, the power MOSFET device may have a pre-mature breakdown due to shorter channel lengths at the cell corners.

Hence, it will be beneficial if there can be provided improved power MOSFETs and methods or processes for making same, which alleviate shortcomings of conventional MOSFETs or conventional methods of making same.

OBJECT OF THE INVENTION

Accordingly, it is an object of the present invention to provide MOSFETs and means and methods of making same which alleviate shortcomings of conventional MOSFETs and methods of making same. At a minimum, it is an object of the present invention to provide the public with a useful alternative of power MOSFET devices and methods of making same.

SUMMARY OF THE INVENTION

Broadly speaking, the present invention has described a MOSFET comprising a plurality of MOSFET cells connected in parallel in which the body region is formed by a method comprising a step of step-profiled selective implantation of impurities.

According to a preferred embodiment of the present invention, there is provided a method of forming a power MOSFET comprising a substrate of a first conductivity type and a body region of a second conductivity type, including the steps of:

forming a gate region of a pre-determined pattern and with a plurality of gate elements partially covering the substrate, said gate element having a stepped cross-sectional profile comprising a thicker portion and a thinner portion, said thicker portion being adapted to substantially prevent passage of impurities therethrough into the substrate during the impurities implantation step, said thinner portion being adapted to allow partial passage of impurities therethrough during the impurities implantation step, implanting impurities into the substrate from the gate region side of the substrate to form a body region of the second conductivity type, wherein, after said impurities implantation step, a step-profiled body region comprising a shallow body region and a deep body region, being formed in the substrate with impurities also present underneath pre-determined regions of said gate elements.

According to another aspect to the present invention, there is provided a MOSFET made by the above method and characterized in that said power MOSFET including a plurality of gate elements which collectively form the gate of said power MOSFET, said gate element having a stepped cross-sectional profile.

Preferably, said stepped cross-sectional profile of said gate element resembling the shape of an Inverted-T.

Preferably, said stepped cross-sectional profile of said gate element comprising a raised head portion which is sandwiched between two depressed shoulder portions each of which defining a step width of said stepped cross-section, said shoulder portion includes a substantially flat region having a thickness which is significantly less than that of said raised portion.

Preferably, the step width of said stepped cross-sectional profile of said gate element being in the region of 0.1 μm to 1.0 μm.

Preferably, the width of said raised head portion of said stepped cross-sectional profile of said gate element being in the region of 0.35 μm to 5 μm.

Preferably, the thinner portion of the gate element having a thickness of about 1,500 Å to 2,500 Å.

Preferably, the width of said thicker portion of said stepped cross-sectional profile of said gate element being in the region of 0.35 μm to 5 μm.

Preferably, the thinner portion of the gate element having a step width of about 0.1 μm to 1.0 μm protruding laterally from said thicker portion of said gate element.

Preferably, said gate element comprising polycrystalline silicon with the thinner portions of the polycrystalline silicon gate formed to a thickness of between 1,500 Å to 2,500 Å before implantation of impurities.

Preferably, said step-profiled body region comprises a thinner shallow body region underneath said gate elements and a thicker deep body region in the portion of said substrate not covered by said gate region or not masked by other blocking means, the thickness of said thinner shallow body region does not exceed 2.0 μm.

Preferably, the separation d7 between adjacent shallow body regions (which is usually called the JFET width, is substantially identical to the width d1 of the raised head portion of the gate-poly) being in the range of between 0.35 μm to 5.0 μm corresponding to a device adapted for a drain voltage range of between 10V to 200V. Preferably, the separation between adjacent shallow body regions underneath said gate element being comparable to the cross-sectional width of said thicker portion of said gate element.

Preferably, the step width of the step-profiled body region being in the region of 0.1 μm to 1.0 μm.

Preferably, the separation between adjacent shallow body regions underneath said gate element being between 0.35 μm to 5.0 μm.

Preferably, the thicker portion of the gate element having a cross-sectional width of between 0.35 μm to 5 μm intermediate the lateral protruding thinner portions of said gate element.

Preferably, said body region having a stepped profile, the step width of said body region and the step width of said gate element being comparable.

Preferably, the step-profiled body region includes a thicker deep body region and a thinner shallow body region, the thickness or depth of said thinner body region not exceeding 2 μm.

According to yet another object of the present invention, there is provided a masking pattern for making the gate region of a power MOSFET, including in the regions of said masking pattern corresponding to the projection of the gate region of the power MOSFET grated portions through which light can pass through and diffused, wherein said grated portions define the stepped profile of said gate elements.

Preferably, said grated portions comprising slits of width 0.1 μm to 0.3 μm and spacing of between 0.1 μm to 0.2 μm.

Preferably, said grated portion including a first slit portion surrounded by a second slit portion, said slit portions having a width between 0.1 μm to 0.3 μm and a spacing of between 0.1 μm to 0.2 μm.

Thus, an improved vertical power MOSFET with a higher cell density, a shallower body-junction and a shorter channel length can be fabricated according to the methods described herein. As a MOSFET made according to the present invention has a shallower, or even an ultra-shallow body-junction, the adverse JFET effect will be alleviated. Moreover, since a shallower body-junction reduces the JFET effect in the epi region between adjacent body-junctions, the spacing between adjacent body junctions can be made much smaller, and the transistor cell pitch will be significantly smaller than that of conventional planar VDMOS transistors. With this advantage, higher cell density per unit area can be achieved and a smaller epi thickness can be employed in the fabrication process for the same blocking voltage. All of these will reduce the on-resistance as well as the gate charge of the transistor.

As the shallower and self-aligned body-junction is primarily defined by implantation rather than by excessive diffusion, the known three-dimensional diffusion problems are substantially alleviated and a shorter channel length can therefore be provided. Furthermore, a power MOSFET made according to the present method offers a deep body-contact-junction for better latch-up immunity without the need of an additional mask as in conventional VDMOS processes.

Furthermore, since the body region is formed by using implantation instead of excessive diffusion and is also self-aligned to the gate-poly, a shorter channel length can be used to sustain the same punch-through breakdown voltage compared to a conventional planar VDMOS transistor. This further reduces the on-resistance.

Thus, an example of a method for fabricating a high density N-channel planar power MOSFET transistor with an ultra-shallow body-junction, a short channel length and a deep body-contact-junction is described in the present invention. Of course, this invention can apply to a P-channel device mutatis mutandis without loss of generality.

BRIEF DESCRIPTION OF THE DRAWINGS

Preferred embodiments of the present invention will be explained in further detail below by way of examples and with reference to the accompanying drawings, in which.

DETAILED DESCRIPTION OF THE PREFERRED EMBODIMENTS

A power MOSFET device is usually formed on a silicon substrate on which an epitaxial layer of a predetermined thickness is formed. The silicon substrate and the epitaxial layer above are doped with impurities so that they have the same conductivity type, say, first type, although the substrate is typically more heavily doped than the epitaxial layer. A body region of an opposite or a second conductivity type is formed in the epitaxial layer and a source region of the first conductivity type is embodied within the body region. The gate region comprises a conductive or doped polycrystalline silicon layer. The drain electrode is formed on the backside surface of the substrate It will be appreciated that the first and second conductivity type can be the P and the N type respectively or vice versa. Although N-type conductivity is used as the first conductivity type used in the example below, it should be understood by a skilled person that the description below will apply mutatis mutandis to a power MOSFET with P-type conductivity as the first conductivity type. Boron and arsenic are examples of impurities suitable for doping the silicon substrate respectively into the P and the N type conductivity.

In order to reduce the on-resistance and to provide an adequate current or power handling capacity, a MOSFET device, especially a power MOSFET, typically comprises a plurality of power MOSFET cells, which are fabricated on a common substrate, connected in parallel. Hence, it will be appreciated, for example, that the gate region of a power MOSFET device actually comprises a plurality of gate elements each of which is the gate of an individual power MOSFET cell.

Figure 1:
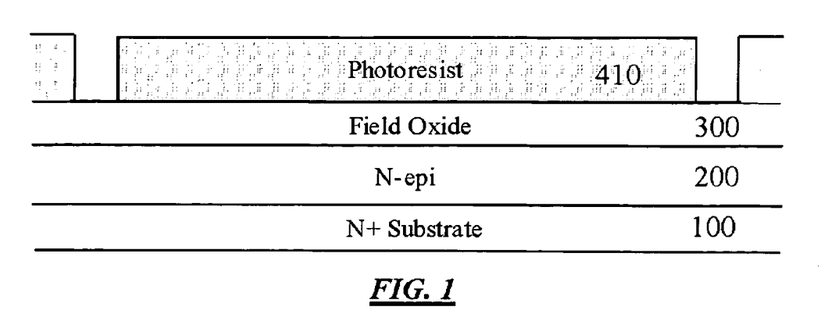
FIG. 1 shows the cross-section of an exemplary N+ Substrate with an N-epitaxial layer with a thick layer of thermal oxide and applied with a first masking photo-resist layer (guard ring mask)
Figure 2:
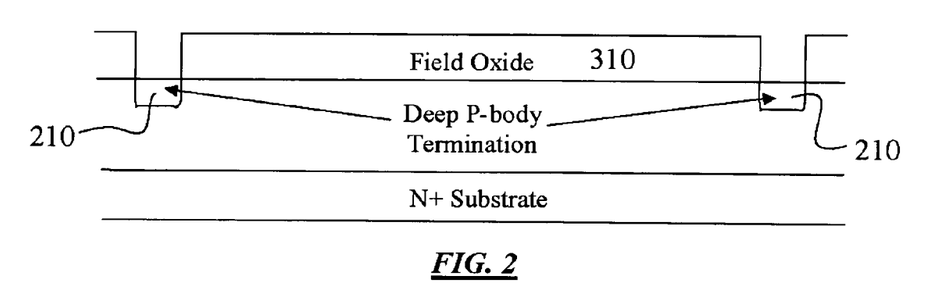
FIG. 2 shows the substrate of FIG. 1 with deep body-termination regions formed.

In the example below, a power MOSFET device with the N conductivity type as the first conductivity type having an N-channel is illustrated as a convenient example. Of course, this invention also applies to devices with either P– or N– channel without loss of generality. Referring to the Figures, an N– channel power MOSFET is to be formed in an N-type epi layer 200 which is grown on an N+ substrate 100, which is more particularly shown in FIG. 1. A thick layer of thermal oxide 7000 A is grown on top of the epi layer as field oxide 300. In addition, a first photo-resist masking layer 410, more commonly known as the guard ring mask, is employed to define the deep body-termination region 210 as shown in FIGS. 1 & 2. Part of the field oxide 300 is then removed by isotropic etching. A thin layer of pad oxide (300A) is then grown as a protective layer during the guard-ring implantation step.

Figure 3:
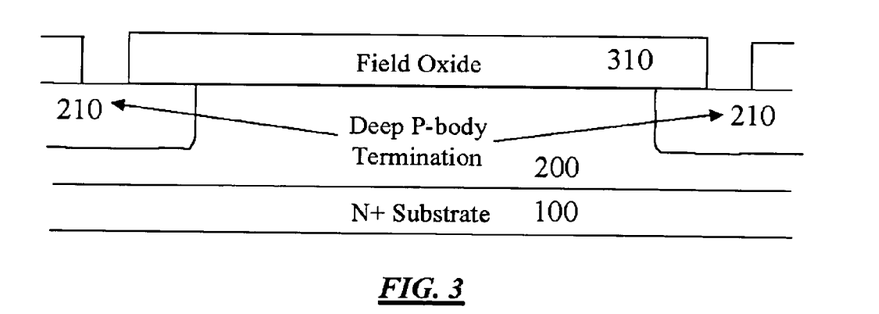
FIG. 3 shows the substrate of FIG. 2 after undergoing a thermal diffusion cycle so that the doping impurities are driven laterally underneath the field oxide layer.

Next, P-type impurity (Boron__1E13 to Boron__5E13) is implanted through the pad oxide to reach the silicon surface as indicated in FIG. 2. A thermal cycle is then employed to drive the impurity laterally underneath the field oxide as indicated in FIG. 3.

Figure 4:
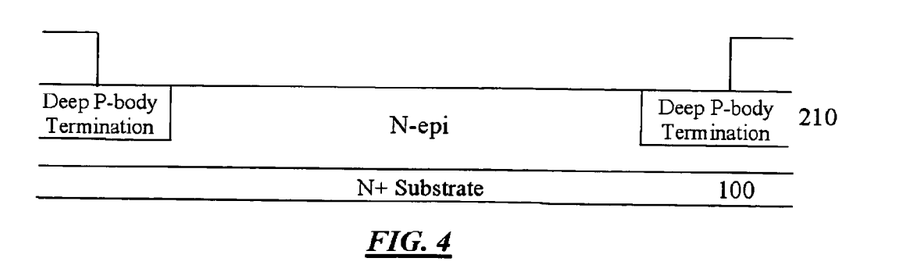
FIG. 4 shows the substrate of FIG. 3 after the field oxide layer in the active area has been removed.
Figure 5:
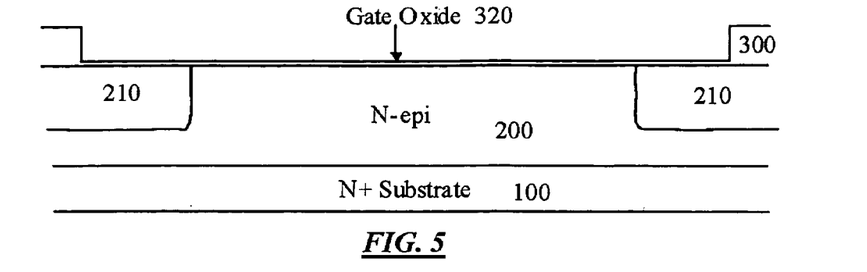
FIG. 5 shows the substrate of FIG. 4 applied with a layer of gate oxide.

A second masking layer, more commonly known as the field termination mask, is used to remove the field oxide in the active area as shown in FIG. 4. Wet etching process is used to remove the field oxide 310 in the active area. After removing the field oxide 310 in the active area, a layer of gate oxide (200 A to 600 A) (320) is grown, as shown in FIG. 5.

Figure 6:
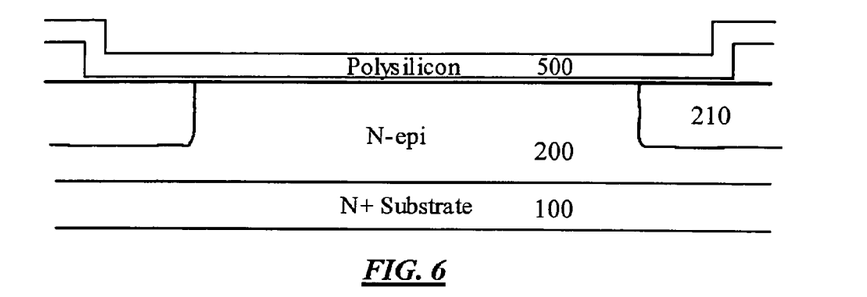
FIG. 6 shows the substrate of FIG. 5 with a layer of doped polysillicon deposited on top of the gate oxide layer.
Figure 7:
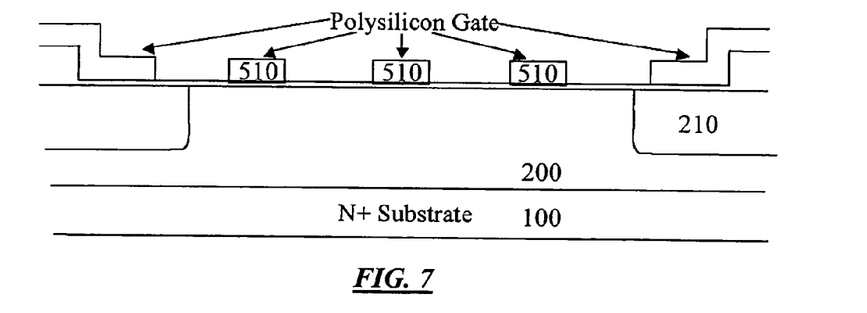
FIG. 7 shows the substrate of FIG. 6 after gate polysillicon patterning masking has taken place.
Figure 8:
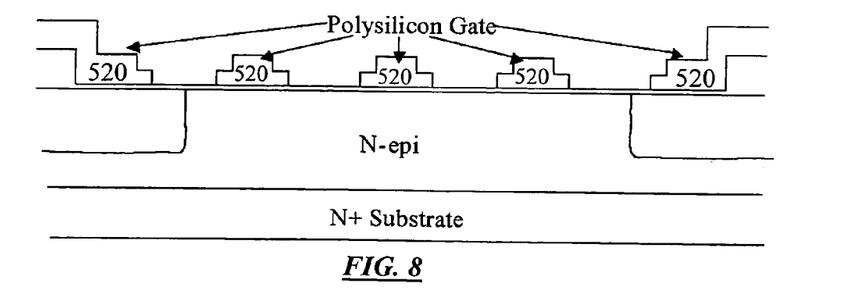
FIG. 8 shows the substrate of FIG. 7 after gate elements having an Inverted-T shape have been formed.

Insitu-doped polysilicon 500 of a thickness about 7000 A is then deposited on top of the gate oxide as shown in FIG. 6. A third mask, more common known as poly-gate mask, is used to define the polycrystalline silicon gate ("poly-gate") or gate elements in the cell area as well as the gate pad in the field area. At this stage and after gate-poly patterning, it will be noted that the shape or cross-section of the individual gate elements 510, showed in FIG. 7, is still substantially the same as that of a typical conventional planar VDMOS device. More specifically, the gate-poly or the individual gate element 510 is rectangular shaped and has a rectangular cross-section or profile, which is markedly different from the profile of the gate elements of a power MOSFET device of this invention. In this invention, it will be appreciated that the poly-gate 520 has a characteristic stepped cross-sectional profile or, more specifically, an "Inverted-T" shaped as shown in FIG. 8.

The significance of a gate element having a stepped cross-sectional profile or an "Inverted-T" shaped has been described above.

Figure 9:
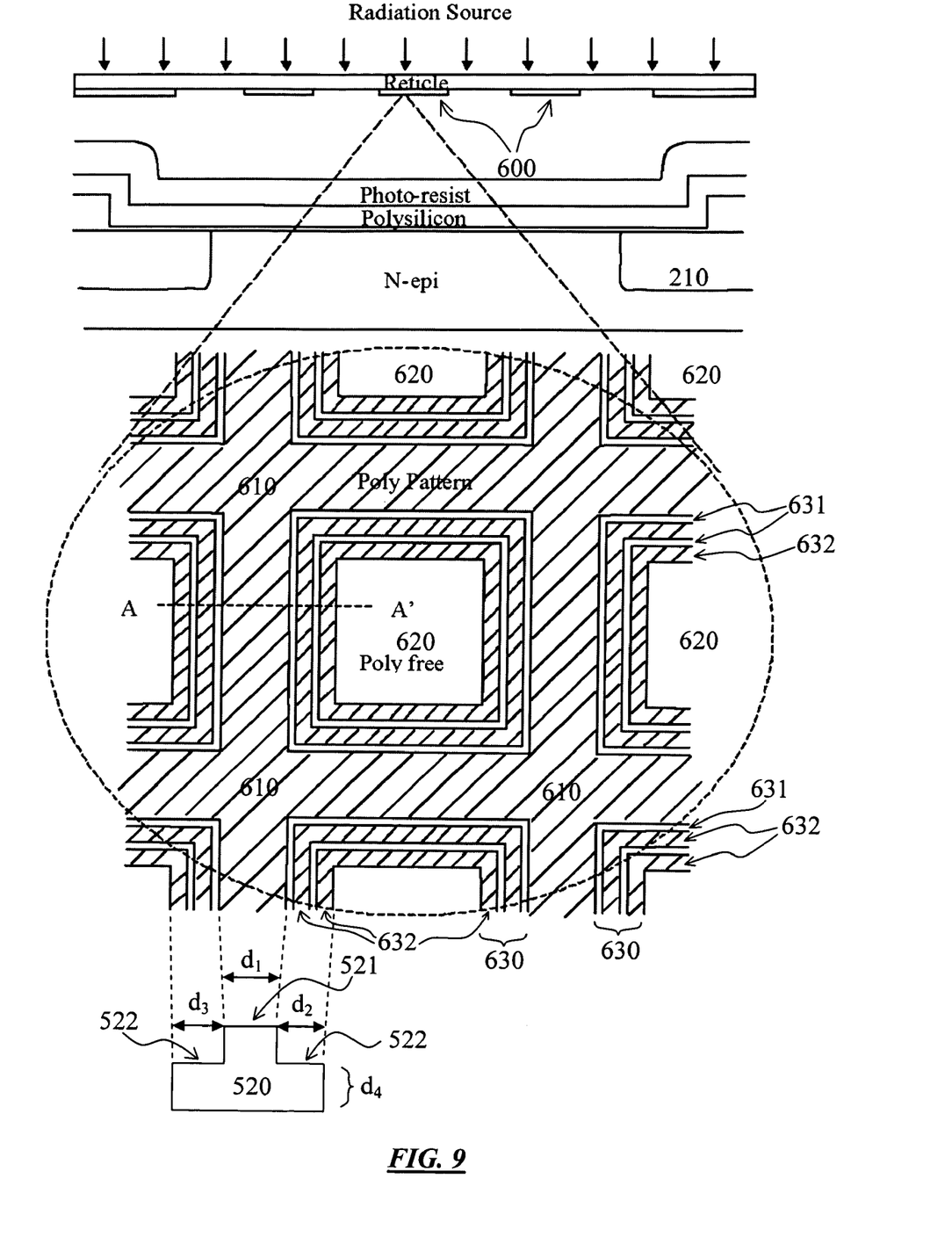
FIG. 9 shows an example of a suitable masking pattern for forming the step-profiled or "Inverted-T" shaped gate elements of FIG. 8.

To obtain an "Inverted-T" shaped poly-gate 520, a photo-resist having a masking pattern 600 as shown in FIG. 9 which can be used for transferring an "Inverted-T" shaped photo-resist 420 onto the gate-poly is shown as an example.

Referring to FIG. 9, the photo-resist masking pattern 600 includes total blocking regions 610 and total passing through regions 620. The total blocking region 610 substantially prevents the photo-resist sensitive radiation to the photo-resist and defines the thickest portion on the cross-sectional profile of the step-profiled gate element. The total passing region 620 substantially permits through passage of the radiation and defines the non-gate region. The total blocking regions and total passing through regions are separated by partial passage regions 630 which allow partial passage of the radiation and define the thinner portion of the gate elements. The partial passage of radiation can be, for example, by diffraction grating, light diffusion or other methodology without loss of generality.

The selective or pre-determined partial blocking or partial passage regions will result in regions of partial exposure of the photo-resist, thereby resulting i n partial development or removal of the photo-resist. By aligning the partial exposure regions so that these regions immediately adjacent to or abut the fully blocked regions, which correspond to the thicker gate regions, a gate region having a thickness less than that,of the thicker gate regions can be obtained. As a result of the partial exposure of the photo-resist and provided that the partial exposure is adequate, gate elements having a stepped cross-sectional profile or a cross-sectional profile resembling the shape of an Inverted-T can be formed.

Referring again to FIG. 9, the gate-poly masking pattern 600 comprises total blocking regions 610 and total passing through regions 620 with partial passage regions 630 (or partial blocking regions) disposed intermediate the total blocking regions and the total passing through regions. The partial blocking region comprises a plurality of interleaving or interposing light passing 631 and light blocking slits 632 abutting the total blocking region. In the present example, each partial blocking pattern comprises two sets of interleaving light passing and light blocking slits abutting on each side of the total blocking region. The light passing and light blocking slits of each partial blocking pattern are substantially parallel. Furthermore, it will be observed that the light passing and light blocking slits of the neighbouring partial blocking regions together from a plurality of quadrangles (or squares) surrounding a common total passing region, with a first partial blocking pattern comprising a first light passing slit and a first light blocking slit surrounding the second partial blocking pattern comprising a second light passing slit and a second light blocking slit. Naturally, more than two sets of partial blocking patterns can be employed. Of course, while slits are shown and described, it will be understood that other equivalent means, such as, for example, slits with discontinuities along the length of the slits can produce the same or similar effect and is therefore to be considered equivalent.

As specific illustrative examples, for forming a gate element with a step or shoulder width of about 1.0 um, the light passing slits have a dimension or width of between 0.10 um to 0.30 um and the light blocking slits (which is equivalent to the spacing between adjacent light passing slits) have a width or dimension of about 0.10 um to 0.20 um.

When the photo-resist is exposed to an appropriate developing radiation, it will be noted that the photo-resist under the partial blocking region will not be fully exposed to the radiation. As a result and due to diffraction or diffusion by the grating effects of the partial blocking region, photo-resist under the diffracted or diffused projection of the partial blocking region will not be fully removed during the development step and some of the photo-resist will be left behind under the partial blocking region.

Figure 10:
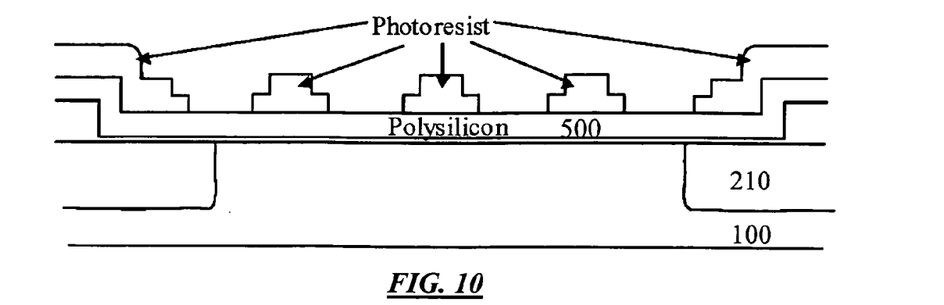
FIG. 10 shows the substrate of FIG. 9 after masking and development steps.

As an example, the thickness of the photo-resist left behind in the narrow-slits region can be controlled by the slit dimension, which is say, between 0.10 um to 0.30 um, slit spacing (say, between 0.10 um to 0.20 um) and exposure condition (for example, 120 mJ/cm$^2$ to 150 mJ/cm$^2$). In addition, the fully exposed photo-resist will be substantially removed and the photo-resist shielded by the poly pattern will be substantially kept intact after the development step as shown in FIG. 10. Hence, by disposing narrow slits adjacent to the gate-poly pattern area, an "Inverted-T" shaped photo-resist pattern (420) can be achieved. After the etching process, the pattern of the "Inverted-T" shaped of the photo-resist (420) can be transferred onto the gate-poly by using one of the two etching methods described below as examples.

Figure 11:
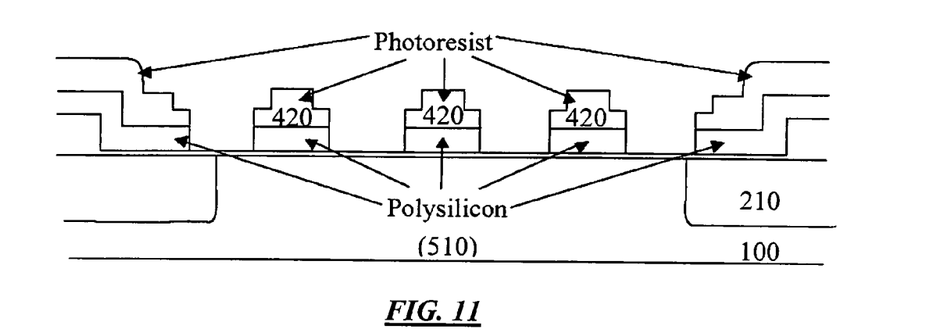
FIG. 11 shows the substrate of FIG. 10 showing the first step in etching the exposed polysillicon.
Figure 12:
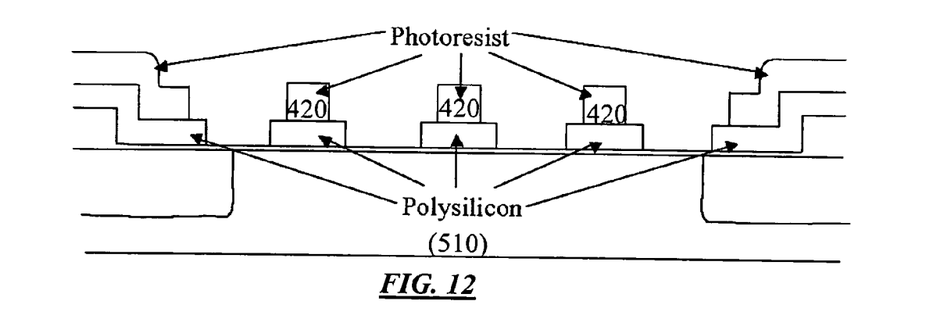
FIG. 12 shows the second step in removing the thinner photo-resist remaining in the substrate after the step of FIG. 11.
Figure 13:
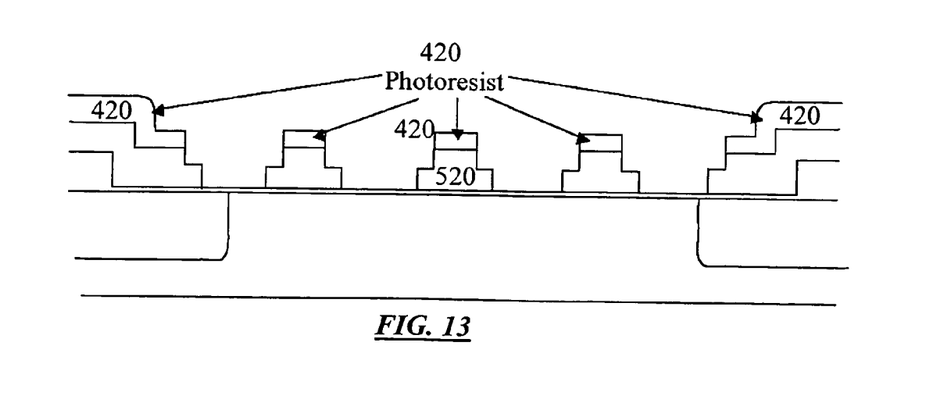
FIG. 13 shows the formation of polysillicon gate elements with an "Inverted-T" cross-section.

The first exemplary method is a three-step etching process. The first step is to etch away the exposed polysilicon by using $CF_4$ as shown in FIG. 11, and then etch the photo-resist anisotropically by using oxygen radical. This will remove the thinner photo-resist and also thin down the thick region of the photo-resist as shown in FIG. 12. Finally, the exposed polysilicon is etched by using $CF_4$ to a certain thickness (say, to between 1500 A to 2500 A) to form a poly gate with an "Inverted-T" shape or cross-section as shown in FIG. 13.

Figure 14:
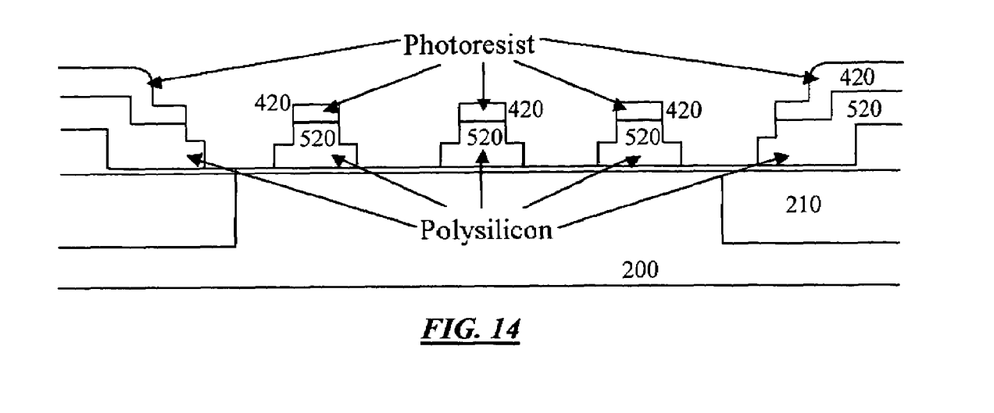
FIG. 14 illustrates an alternative method for one-step formation of the "Inverted-T" polysillicon gate elements.

The second method is a one-step etch process by which the exposed polysilicon and the photo-resist are etched simultaneously by chemicals such as $CF_4$ and HBr until the exposed polysilicon and the thinner photo-resist have been removed while the poly at the thinner photo-resist region reaches a certain predetermined thickness (around 1500 A to 2500 A) as shown in FIG. 14.

Figure 15:
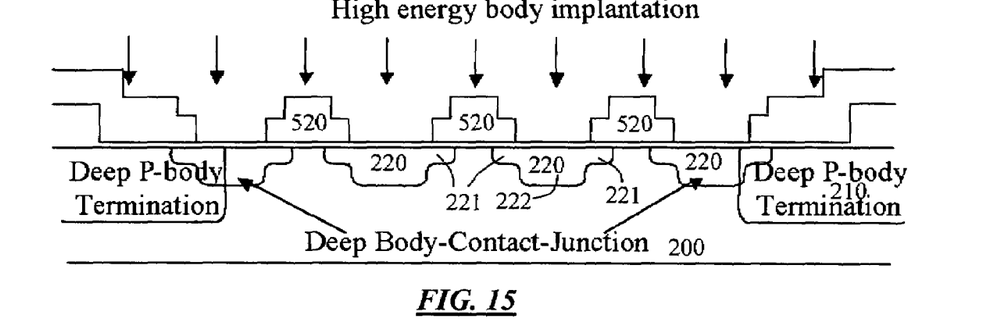
FIG. 15 shows the step of implanting impurities into the substrate to define the P-body region.
Figure 16:
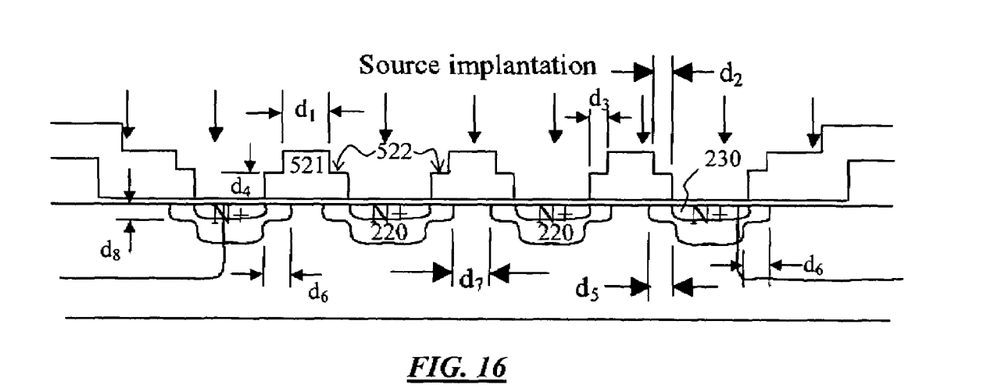
FIG. 16 illustrates the implantation of N-type impurities to form the N+ source region after the step of FIG. 15.

Referring particularly to FIGS. 9 and 15–16, gate elements 520 of the present invention has a characteristic Inverted-T shape comprising a thicker gate poly with a protruding head portion 521 having a width d1 which is interposed or sandwiched between two thinner or shoulder regions 522 of gate polys respectively of widths d2 and d3 which are substantially identical. The shoulder portion 522 protrudes laterally from the sandwiched middle and thicker raised gate poly portion. The shoulder region includes a generally flat region forming a step in the cross-sectional profile of the gate elements 520. Typically, the thinner gate poly has a thickness d4 of between 1500 A to 2500 A.

Next, a high energy and blanket P-type implantation (for example, Boron_1E13_120 kev to Boron_5E13_140 kev) is performed to define the P-body region 220 as shown in FIG. 15. It will be appreciated that high-energy impurities can partially penetrate through the thin poly region to form a shallower or even an ultra-shallow body region and therefore a shallower or even an ultra-shallow body-junction, but the thick poly region blocks the high-energy impurities and prevent them from reaching the silicon surface. At the same time, high-energy impurities can go even deeper into the silicon in the regions not effectively covered by polysilicon. The deep body regions thus formed will result in a desirable deep body-contact-junction that can improve the ruggedness of the device.

It is noteworthy that, as the step width (d5, d6) of the body region 220, that is, the difference between the lateral spread of the shallow body region 221 and the deep body region 222, defines the channel length, a short channel can be resulted. It will be noted that a short channel length is defined by the partial blocking region which is determined by the total effective width of the series of the slits. In addition, the formation of the body region is self-aligned to the gate-poly by this method. In this example, the step-width (d5, d6) of the body region is comparable to the step width (d2) of the gate element and is in the region of 0.1 μm to 1 μm.

Furthermore, as the separation (d7) between adjacent shallow body regions determines the JFET characteristic of a power MOSFET device and this width d7 is substantially equal to the width d1 of the protruding head portion 521, the JFET width (d7) can be more accurately controlled and minimised. For example, for devices adapted for a drain voltage range of between 10V to 200V, the width of the raised head portion can be controlled to between the range of 0.35 μm to 5 μm so as to give a JFET width of the same range. By utilising a gate-poly having the above characteristic profile, a very shallow P-body region can be formed. For the above described drain voltage range, a shallow P-body with a junction depth d8 of less than 2 μm can be achieved. It is appreciated that a shallower junction depth is preferred as long as the breakdown voltage can be supported.

Figure 17:
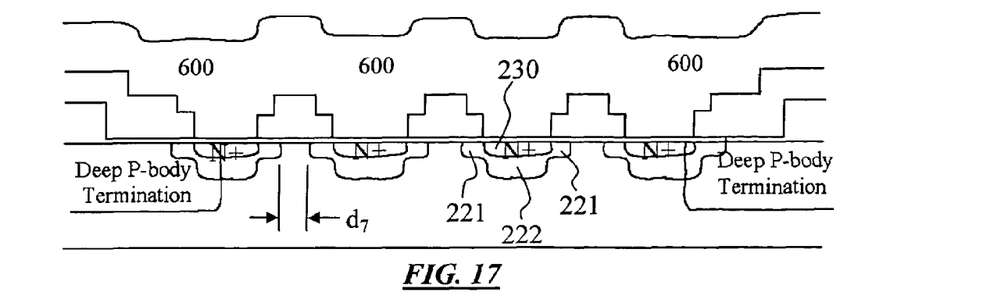
FIG. 17 shows the substrates of FIG. 16 after a high temperature process to achieve better planarization and source impurities annealing.

After formation of the P body region, blanket N-type implantation, for example, with Arsenic_5E15, is used to form the N+ source region 230 as shown in FIG. 16. USG (Undoped Silicate Glass) and BPSG (Borophosphosilicate Glass) are next deposited as the ILD (Inter-Layer Dielectric) 600. A high temperature process is then used to flow the BPSG to achieve better planarization and anneal the source impurities as shown in FIG. 17.

Figure 18:
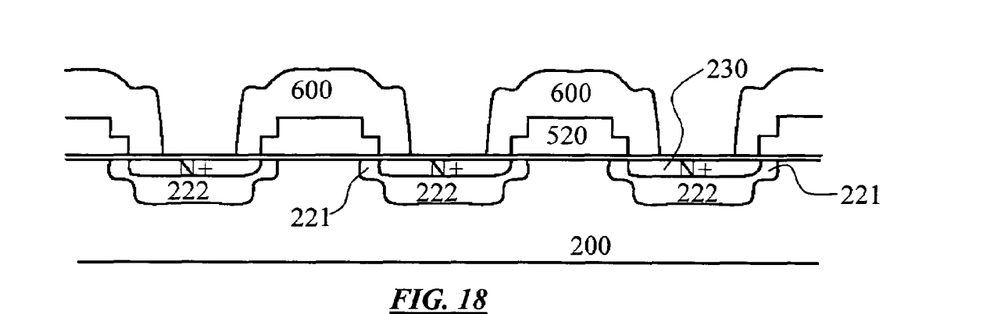
FIG. 18 illustrates the step of contact region definition and the use of anisotropic etching to open the contact regions.
Figure 19:
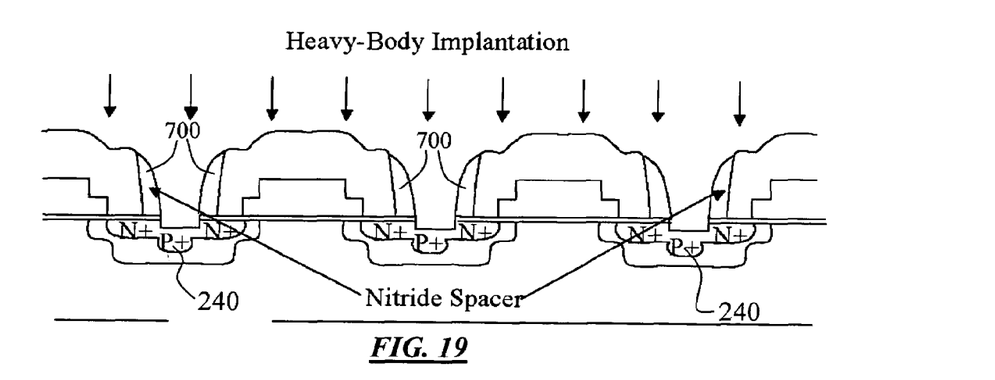
FIG. 19 illustrates the step of a blanket P+ implantation to form the P-body contacts.
Figure 20:
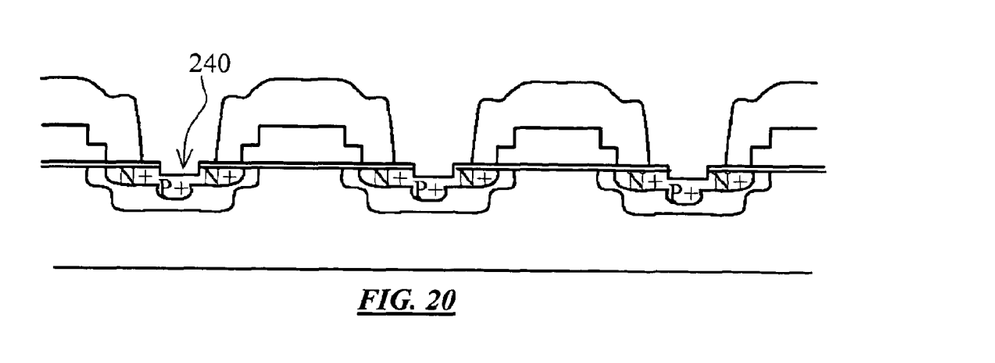
FIG. 20 illustrates the semi-processed substrate with spacers removed.
Figure 21:
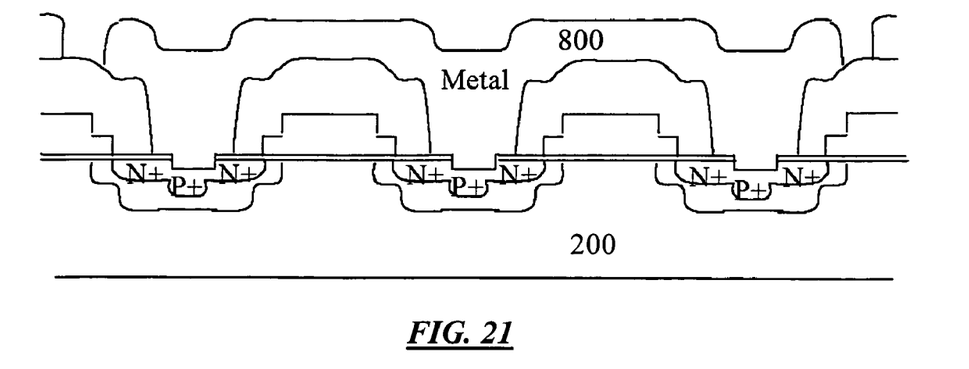
FIG. 21 illustrates the use of a fifth mask to define the source and gate pads.
Figure 22:
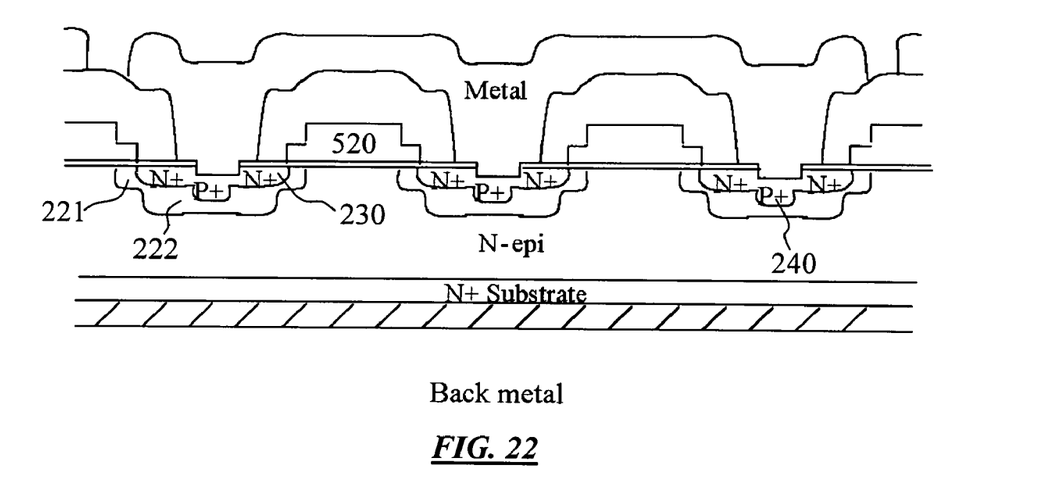
FIG. 22 illustrates back-grinding of the substrate and backside metal deposition.

A fourth mask (contact mask) is subsequently employed to define the contact region, and anisotropic etching is used to open the contacts as shown in FIG. 18. A layer of nitride (2000 A–3000 A) 700 is deposited and then etched back by a nisotropic etching to create nitride spacers in the contact holes. 1000 A to 3000 A of silicon at the surface is removed in the nitride etch-back. Thereafter, a blanket P+ implantation (say, for example, $BF_2$ 1E15 to 3E15) is performed to form the P-body contacts 240 as shown in FIG. 19. Hot $H_3PO_4$ (Phosphoric acid) is used to remove the nitride spacers in the contact holes as shown in FIG. 20. A layer of aluminium 800 is then deposited to fill the contact holes and patterned using the fifth mask (metal mask) to define the source and gate pads as shown in FIG. 21. Finally, the wafer will have the back-grinding to reduce the substrate resistance, and the backside metal deposition as shown in FIG. 22. The backside of the wafer is the drain terminal.

While the present invention has been explained by reference to the preferred embodiments of power MOSFETs described above, it will be appreciated that the embodiments are illustrated as examples to assist understanding of the present invention and are not meant to be restrictive on the scope and spirit of the present invention. The scope of this invention should be determined from the general principles and spirit of the invention as described above. In particular, variations or modifications which are obvious or trivial to persons skilled in the art, as well as improvements made on the basis of the present invention, should be considered as falling within the scope and boundary of the present invention.

Furthermore, while the present invention has been explained by reference to power MOSFETs, it should be appreciated that the invention can apply, whether with or without modification, to other power MOSFETs and other similar semiconductor devices without loss of generality.

The invention claimed is:

1. A method of forming a power MOSFET comprising a substrate of a first conductivity type and a body region of a second conductivity type, including the steps of:
    forming a gate region of a pre-determined pattern and with a plurality of gate elements partially covering the substrate, said gate elements having a stepped cross-sectional profile comprising a thicker portion and a thinner portion, said thicker portion being adapted to substantially prevent passage of impurities therethrough into the substrate during an impurities implantation step, said thinner portion being adapted to allow partial passage of impurities therethrough during the impurities implantation step, and
    implanting impurities into the substrate from the gate region side of the substrate to form a body region of the second conductivity type, wherein, after said impurities implantation step, a step-profiled body region, comprising a thinner shallow body region underneath said gate elements and a thicker deep body region in the portion of said substrate not covered by said gate region and not masked by other blocking means, is formed in the substrate with impurities also present underneath pre-determined regions of said gate elements, wherein the thickness of said thinner shallow body region does not exceed 2.0 µm.

2. A method according to claim 1, wherein said stepped cross-sectional profile of said gate element resembles the shape of an Inverted-T.

3. A method according to claim 1, wherein said stepped cross-sectional profile of said gate element comprises a raised head portion which is sandwiched between two depressed shoulder portions each of which defines a step width of said stepped cross-section, and said shoulder portion includes a substantially flat region having a thickness which is significantly less than that of said raised portion.

4. A method according to claim 3, wherein the step width of said stepped cross-sectional profile of said gate element is in the region of 0.1 µm to 1.0 µm.

5. A method according to claim 3, wherein the width of said raised head portion of said gate element is in the region of 0.35 µm to 5 µm.

6. A method according to claim 1, wherein the thinner portion of said stepped cross-sectional profile of the gate element has a typical thickness of about 1,500 A to 2,500 A.

7. A method according to claim 1, wherein the width of said thicker portion of said stepped cross-sectional profile of said gate element is in the region of 0.35 µm to 5 µm.

8. A method according to claim 7, wherein the thinner portion of the gate element has a step width of about 0.1 µm to 1.0 µm protruding laterally from said thicker portion of said gate element.

9. A method according to claim 1, wherein said gate element comprises polycrystalline silicon with the thinner portions of the polycrystalline silicon gate formed to a thickness of between 1,500 A to 2,500 A before implantation of impurities.

10. A method according to claim 1, wherein the separation between adjacent shallow body regions is between 0.35 µm to 5.0 µm.

11. A method according to claim 1, wherein the separation between adjacent shallow body regions is comparable to the cross-sectional width of said thicker portion of said gate element.

12. A method according to claim 1, wherein the step width of the step-profiled body region is in the region of 0.1 µm to 1.0 µm.

13. A power MOSFET comprising a substrate of a first conductivity type including a plurality of gate elements partially covering the substrate which collectively form the gate of said power MOSFET, said gate elements having a stepped cross-sectional profile, and a body region of a second conductivity type that comprises a thinner shallow body region underneath said gate elements and a thicker deep body region in the portion of said substrate not covered by said gate region and not masked by other blocking means, wherein the thickness of said thinner shallow body region does not exceed 2.0 µm.

14. A power MOSFET according to claim 13, wherein said stepped cross-sectional profile of said gate element resembles the shape of an Inverted-T.

15. A power MOSFET according to claim 13, wherein said stepped cross-sectional profile of said gate element comprises a raised head portion which is sandwiched between two depressed shoulder portions each of which defines a step width of said stepped cross-section, and said shoulder portion includes a substantially flat region having a thickness which is significantly less than that of said raised portion.

16. A power MOSFET according to claim 15, wherein the step width of said stepped cross-sectional profile of said gate element is in the region of 0.1 µm to 1.0 µm.

17. A power MOSFET according to claim 15, wherein the width of said raised head portion of said stepped cross-sectional profile of said gate element is in the region of 0.35 µm to 5 µm.

18. A power MOSFET according to claim 13, wherein the thinner portion of the gate element has a thickness of about 1,500 A to 2,500 A.

19. A power MOSFET according to claim 13, wherein the width of said thicker portion of said stepped cross-sectional profile of said gate element is in the region of 0.35 µm to 5 µm.

20. A power MOSFET according to claim 19, wherein the thinner portion of the gate element has a step width of about 0.1 µm to 1.0 µm protruding laterally from said thicker portion of said gate element.

21. A power MOSFET according to claim 13, wherein said gate element comprises polycrystalline silicon with the thinner portions of the polycrystalline silicon gate formed to a thickness of between 1,500 A to 2,500 A before implantation of impurities.

22. A power MOSFET according to claim 13, wherein the separation between adjacent shallow body regions is in the range of 0.35 to 5.0 µm.

23. A power MOSFET according to claim 13, wherein the separation between adjacent shallow body regions underneath said gate element is comparable to the cross-sectional width of said thicker portion of said gate element.

24. A power MOSFET according to claim 13, wherein the step width of the step-profiled body region is in the region of 0.1 µm to 1.0 µm.

25. A power MOSFET according to claim 13, wherein the separation between adjacent shallow body regions underneath said gate element is in the range of 0.35 µm to 5.0 µm.

26. A power MOSFET according to claim 13, wherein the thicker portion of the gate element has a cross-sectional width from 0.35 µm to 5.0 µm intermediate the lateral protruding thinner portions of said gate element.

27. A power MOSFET comprising a substrate of a first conductivity type including a plurality of gate elements partially covering the substrate which collectively form the gate of said power MOSFET, said gate elements having a stepped cross-sectional profile, and a body region of a second conductivity type wherein said body region has a stepped profile, the step width of said body region and the step width of said gate element being comparable.

28. A power MOSFET according to claim 27, wherein the step-profiled body region includes a thicker deep body region and a thinner shallow body region, the thickness or depth of said thinner body region not exceeding 2.0 µm.

29. A power MOSFET according to claim 27, wherein the thickness or depth of said shallow body region is in the region of 0.5 µm to 2 µm.

30. A power MOSFET according to claim 27, wherein said stepped profile of said body region resembles a T shape and said gate elements have an Inverted-T cross-section.

31. A power MOSFET according to claim 27, wherein the separation between adjacent body regions is in the region of 0.35 µm to 5.0 µm.

32. A power MOSFET according to claim 27, wherein the separation between adjacent body regions define JFET characteristics and are in the region of 0.35 µm to 5.0 µm.

33. A power MOSFET according to claim 32, wherein the shallow body region junction depth is in the region of 0.5 µm to 2.0 µm.

34. A power MOSFET according to claim 13, wherein the width of said thinner portion is in the region of 0.1 µm to 1.0 µm.

* * * * *